(12) United States Patent
Grill et al.

(10) Patent No.: US 11,066,748 B2
(45) Date of Patent: Jul. 20, 2021

(54) MICROWAVE PLASMA AND ULTRAVIOLET ASSISTED DEPOSITION APPARATUS AND METHOD FOR MATERIAL DEPOSITION USING THE SAME

(71) Applicant: International Business Machines Corporation, Armonk, NY (US)

(72) Inventors: Alfred Grill, White Plains, NY (US); Son V. Nguyen, Schenectady, NY (US); Deepika Priyadarshini, Guilderland, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 16/544,281

(22) Filed: Aug. 19, 2019

(65) Prior Publication Data

US 2019/0368044 A1 Dec. 5, 2019

Related U.S. Application Data

(62) Division of application No. 15/255,694, filed on Sep. 2, 2016, now Pat. No. 10,428,428, which is a division
(Continued)

(51) Int. Cl.
*C23C 16/52* (2006.01)
*C23C 16/48* (2006.01)
(Continued)

(52) U.S. Cl.
CPC .............. *C23C 16/52* (2013.01); *C23C 16/14* (2013.01); *C23C 16/274* (2013.01); *C23C 16/34* (2013.01);
(Continued)

(58) Field of Classification Search
CPC ........................... C23C 16/482; C23C 16/274
See application file for complete search history.

(56) References Cited

U.S. PATENT DOCUMENTS

| | | | |
|---|---|---|---|
| 4,724,159 A | 2/1988 | Yamazaki | |
| 4,926,791 A * | 5/1990 | Hirose | C23C 16/511 |
| | | | 118/715 |

(Continued)

OTHER PUBLICATIONS

Office Action dated Oct. 7, 2020 received in U.S. Appl. No. 16/544,317.
(Continued)

*Primary Examiner* — Joseph A Miller, Jr.
(74) *Attorney, Agent, or Firm* — Scully, Scott, Murphy & Presser, P.C.; Daniel P. Morris, Esq.

(57) ABSTRACT

A deposition apparatus for depositing a material on a substrate is provided. The deposition apparatus has a processing chamber defining a processing space in which the substrate is arranged, an ultraviolet radiation assembly configured to emit ultraviolet radiation and a microwave radiation assembly configured to emit microwave radiation into an excitation space that can be the same as the processing space, and a gas feed assembly configured to feed a precursor gas into the processing space and a reactive gas into the excitation space. The ultraviolet radiation assembly and the microwave radiation assembly are operated in combination to excite the reactive gas in the excitation space. The material is deposited on the substrate from the reaction of the excited reactive gas and the precursor gas. A method for using the deposition apparatus to deposit a material on a substrate is provided.

15 Claims, 10 Drawing Sheets

Related U.S. Application Data of application No. 14/149,122, filed on Jan. 7, 2014, now Pat. No. 9,435,031.

(51) Int. Cl.
| | |
|---|---|
| *C23C 16/515* | (2006.01) |
| *C23C 16/511* | (2006.01) |
| *C23C 16/455* | (2006.01) |
| *C23C 16/14* | (2006.01) |
| *C23C 16/27* | (2006.01) |
| *C23C 16/34* | (2006.01) |
| *C23C 16/452* | (2006.01) |

(52) U.S. Cl.
CPC ........ *C23C 16/452* (2013.01); *C23C 16/4558* (2013.01); *C23C 16/482* (2013.01); *C23C 16/511* (2013.01); *C23C 16/515* (2013.01); *C23C 16/45512* (2013.01)

(56) References Cited

U.S. PATENT DOCUMENTS

| | | | |
|---|---|---|---|
| 5,138,520 A | 8/1992 | McMillan et al. | |
| 5,203,959 A | 4/1993 | Hirose et al. | |
| 5,855,675 A * | 1/1999 | Doering | C23C 16/44 |
| | | | 118/719 |
| 5,985,091 A | 11/1999 | Suzuki | |
| 6,007,878 A | 12/1999 | Takada et al. | |
| 7,125,588 B2 | 10/2006 | Miyanaga et al. | |
| 7,141,756 B2 | 11/2006 | Ohmi et al. | |
| 7,470,454 B2 | 12/2008 | Lukas et al. | |
| 7,527,693 B2 | 5/2009 | Derderian et al. | |
| 8,298,372 B2 | 10/2012 | Kim et al. | |
| 9,246,099 B1 * | 1/2016 | Hsueh | C23C 16/45536 |
| 2001/0054769 A1 | 12/2001 | Raaijmakers et al. | |
| 2002/0050486 A1 | 5/2002 | Ishii et al. | |
| 2002/0069966 A1 | 6/2002 | Elliott et al. | |
| 2002/0072244 A1 * | 6/2002 | Agarwal | H01L 21/314 |
| | | | 438/758 |
| 2003/0020414 A1 | 1/2003 | Schmitkons et al. | |
| 2004/0053472 A1 | 3/2004 | Kiryu et al. | |
| 2004/0107910 A1 | 6/2004 | Nakata et al. | |
| 2005/0092243 A1 | 5/2005 | Suzuki | |
| 2007/0128876 A1 * | 6/2007 | Fukiage | H01J 37/3244 |
| | | | 438/710 |
| 2009/0017190 A1 | 1/2009 | Sferlazzo et al. | |
| 2010/0034984 A1 * | 2/2010 | Asmussen | H01J 37/32256 |
| | | | 427/575 |
| 2010/0087050 A1 | 4/2010 | Armour et al. | |
| 2012/0068603 A1 * | 3/2012 | Itoh | H01J 37/3222 |
| | | | 315/111.41 |
| 2013/0001204 A1 | 1/2013 | Mistry et al. | |
| 2013/0040044 A1 | 2/2013 | Larson et al. | |

OTHER PUBLICATIONS

Office Action dated Jan. 6, 2021 received in a related application, namely U.S. Appl. No. 16/544,317, 11 pages.

Office Action dated May 17, 2021 received in a related application, namely U.S. Appl. No. 16/544,317, 11 pages.

* cited by examiner

MICROWAVE PLASMA AND ULTRAVIOLET ASSISTED DEPOSITION APPARATUS AND METHOD FOR MATERIAL DEPOSITION USING THE SAME

BACKGROUND

Chemical vapor deposition (CVD) techniques, such as atmospheric-pressure CVD (APCVD), low-pressure CVD (LPCVD), plasma-assisted CVD (PACVD), or plasma-enhanced CVD (PECVD) and thermal CVD, are used for depositing a material on a substrate. In CVD processes, a layer of material is formed by the reaction of gaseous material reactants at or near a substrate surface.

Advanced techniques including tooling and processes are being developed to meet requirements for deposition of material with increased conformality, reduced plasma induced damage and industrial scale-up capability.

SUMMARY

In one embodiment of the present invention, an apparatus for depositing a material on a substrate is provided. The apparatus has a processing chamber defining a processing space in which the substrate is arranged, an ultraviolet radiation assembly configured to emit ultraviolet radiation into the processing space, a microwave radiation assembly configured to emit microwave radiation into the processing space, and a gas feed assembly configured to feed: a precursor gas into the processing space, and a reactive gas into the processing space, wherein: the ultraviolet radiation assembly and the microwave radiation assembly are configured to be operated in combination to emit ultraviolet radiation and microwave radiation to excite at least the reactive gas in the processing space, and the material is deposited on the substrate in the processing space from the reaction of the precursor gas and the excited reactive gas.

In another embodiment of the present invention, an apparatus for depositing a material on a substrate is provided. The apparatus has a processing chamber defining a processing space in which the substrate is arranged, a remote excitation chamber that defines an excitation space, wherein the excitation space is provided remotely from the processing space, a gas feed assembly configured to feed: a precursor gas into the processing space, and a reactive gas into the excitation space, an ultraviolet radiation assembly arranged to the remote excitation chamber, wherein the ultraviolet radiation assembly is configured to emit ultraviolet radiation into the excitation space to excite the reactive gas, a microwave radiation assembly arranged to the remove excitation chamber, wherein the microwave radiation assembly is configured to emit microwave radiation into the excitation space to excite the reactive gas, and a conduit communicating the excitation space and the processing space to facilitate diffusion of excited reactive gas from the excitation space to the processing space, wherein the material is deposited on the substrate in the processing space from the reaction of the precursor gas and the excited reactive gas.

In another embodiment of the present invention, a method for depositing a material on a substrate is provided. The method includes feeding a precursor gas into a processing space in which the substrate is arranged, feeding a reactive gas into the processing space, operating an ultraviolet radiation assembly to emit ultraviolet radiation into the processing space in combination with operating a microwave radiation assembly to emit microwave radiation into the excitation space to excite at least the reactive gas, and depositing the material on the substrate in the processing space from the reaction of the excited reactive gas and the precursor gas.

In another embodiment of the present invention, a method for depositing a material on a substrate is provided. The method includes feeding a precursor gas into a processing space defined by a processing chamber in which the substrate is arranged, feeding a reactive gas into an excitation space defined by a remote excitation chamber provided remotely from the processing space, operating an ultraviolet radiation assembly to emit ultraviolet radiation into the excitation space in combination with operating a microwave radiation assembly to emit microwave radiation into the excitation space to excite the reactive gas, flowing the excited reactive gas from the excitation space to the processing space, and depositing the material on the substrate in the processing space from the reaction of the excited reactive gas and the precursor gas.

DETAILED DESCRIPTION

Figure 1:
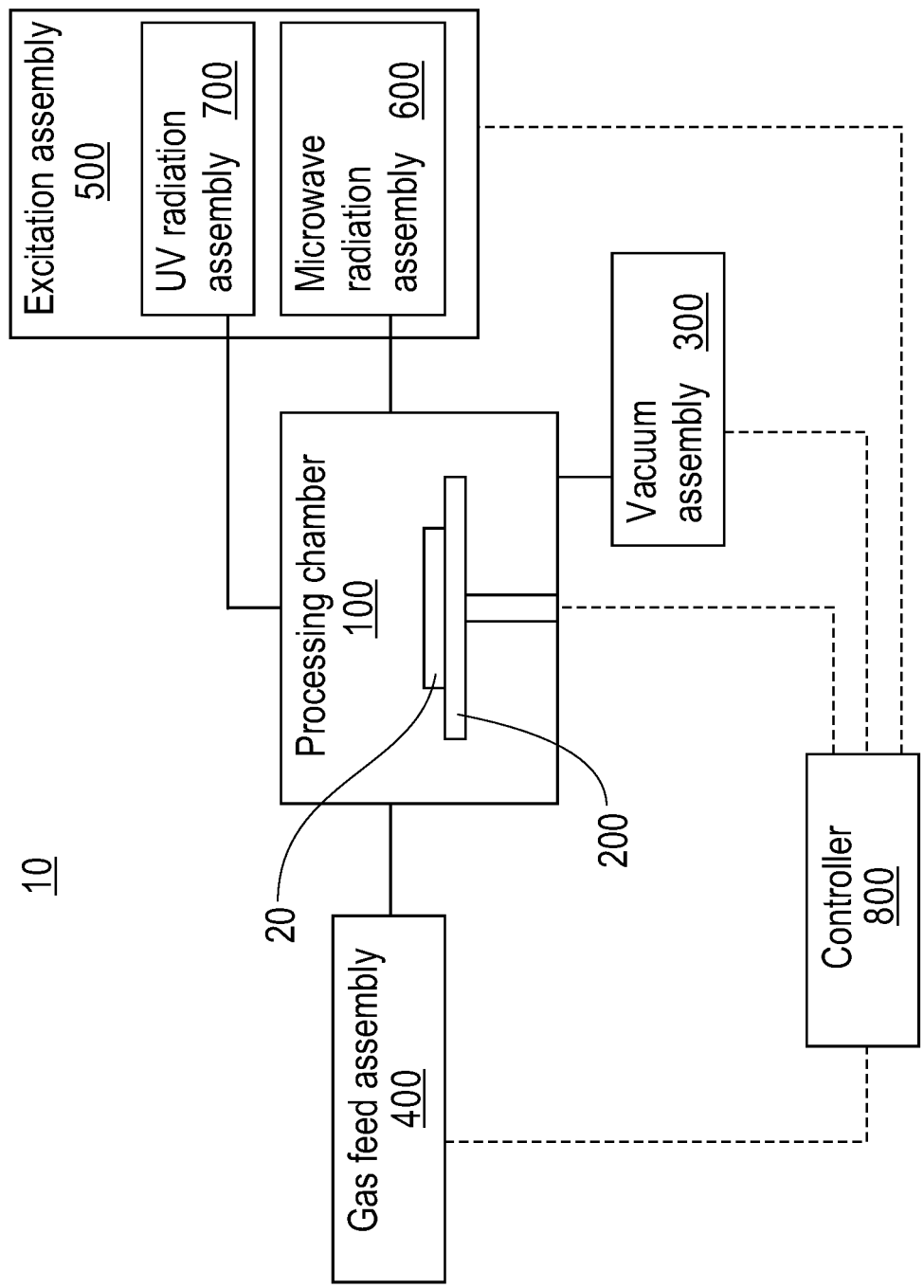
FIG. 1 is a schematic diagram of a deposition apparatus according to a first embodiment of the present invention.

Techniques for material deposition will be described in greater detail by referring to the following description and drawings that accompany the present application. It is noted that the drawings of the present application are provided for illustrative purposes only and, as such, the drawings are not drawn to scale.

In the following description, numerous specific details are set forth, such as particular structures, components, materials, dimensions, processing steps and techniques, in order to provide a thorough understanding of the present invention. However, it will be appreciated by one of ordinary skill in the art that the present invention may be practiced without these specific details. In other instances, well-known structures or processing steps have not been described in detail in order to avoid obscuring the present invention.

A deposition apparatus 10 according to a first embodiment of the present invention will be described in detail below with reference to FIGS. 1-4. The deposition apparatus 10 can include a processing chamber 100, a substrate stage assembly 200, a vacuum assembly 300, a gas feed assembly 400, an excitation assembly 500 including a microwave radiation assembly 600 and an ultraviolet (UV) radiation assembly 700, and a controller 800.

FIG. 1 is a schematic diagram of the deposition apparatus 10. The substrate stage assembly 200, which is configured to hold a substrate 20, is arranged within the processing chamber 100. The vacuum assembly 300 is fluidly connected to the interior of the processing chamber 100 to control the interior pressure within the processing chamber 100. The gas feed assembly 400 is fluidly connected to the interior of the processing chamber 100 to feed one or more gases into the interior of the processing chamber 100. The microwave radiation assembly 600 is arranged to the processing chamber 100 to emit microwave radiation into the interior of the processing chamber 100. The UV radiation assembly 700 is provided together with the microwave radiation assembly 600 as the excitation assembly 500 and arranged to the processing chamber 100 to emit UV radiation into the interior of the processing chamber 100. The controller 800 is in communication with and controls one or more of the processing chamber 100, the substrate stage assembly 200, the vacuum assembly 300, the gas feed assembly 400, the microwave radiation assembly 600, and the UV radiation assembly 700, to receive information from these elements and to send information and controlling instructions to these elements.

Figure 2:
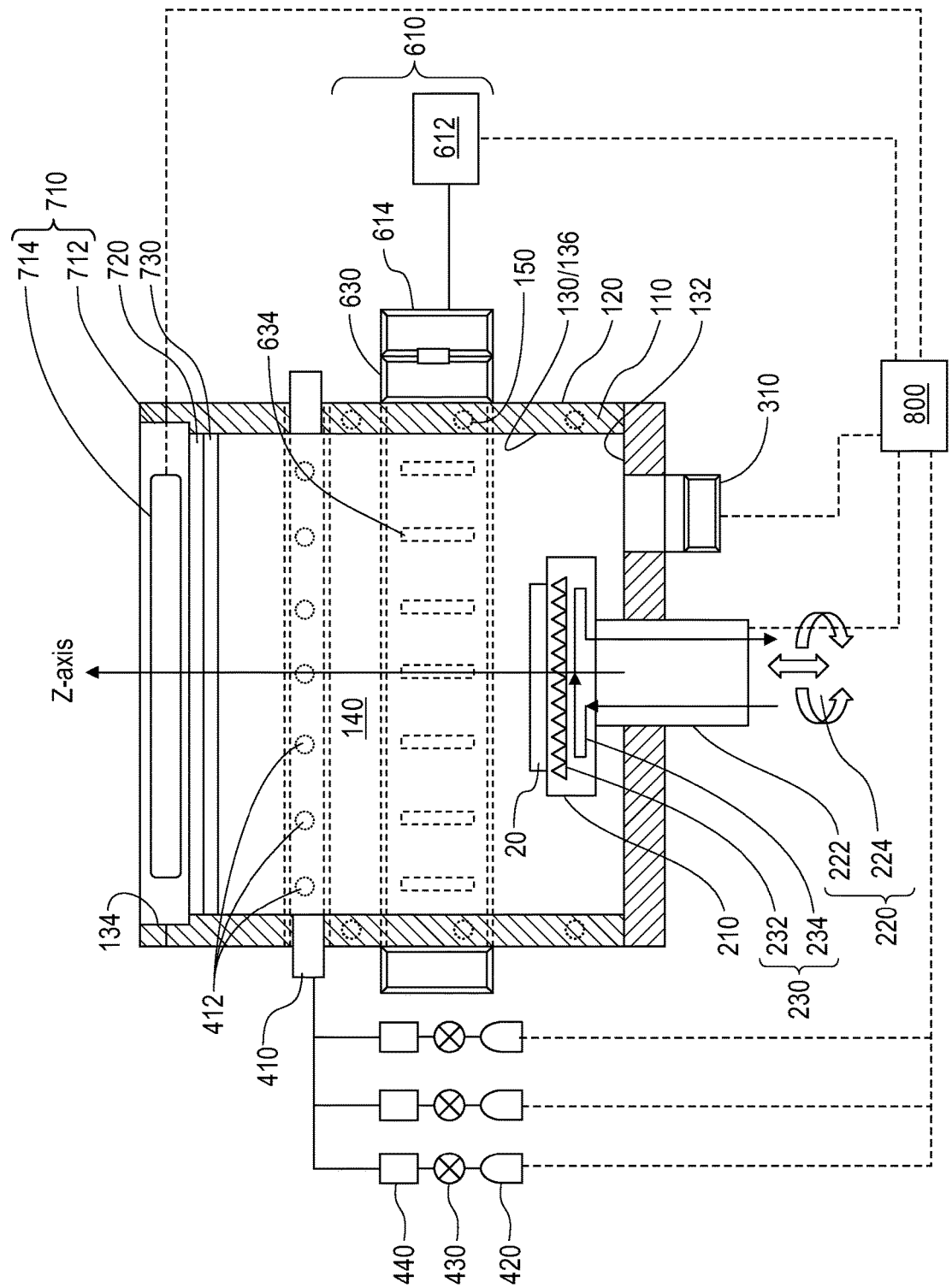
FIG. 2 is another schematic diagram of the deposition apparatus with a first configuration of an excitation assembly according to the first embodiment of the present invention.

FIG. 2 is another schematic diagram of the deposition apparatus 10. Additional detailed description of the processing chamber 100, the substrate stage assembly 200, the vacuum assembly 300, the gas feed assembly 400, the excitation assembly 500 including the microwave radiation assembly 600 and the UV radiation assembly 700, and the controller 800 will be provided below with reference to FIG. 2.

Processing Chamber

The processing chamber 100 can include a processing chamber body 110 provided along a central Z-axis in a cylindrical coordinate, and a processing chamber body temperature control assembly 150.

The processing chamber body 110 can include a processing chamber body outer wall 120 and a processing chamber body inner wall 130. The processing chamber body inner wall 130 defines a processing space 140 that is substantially cylindrical. The processing chamber body inner wall 130 includes an inner base wall 132 provided at a reference axial location $Z_0$ (or z=0) along the central Z-axis, an inner top wall 134 provided at a height of $Z_A > Z_0$, and an inner side wall 136 aligned along the central Z-axis and connecting inner base wall 132 and inner top wall 134. The value of $Z_A$ can be determined based on the geometry of the substrate 20 to be processed by the deposition apparatus 10, and the geometry and arrangement of the gas feed assembly 400, the microwave radiation assembly 600 and UV radiation assembly 700. The inner base wall 132 has a radius of $R_1$ that can be determined based on the geometry of the substrate 20 to be processed by the deposition apparatus 10, and the geometry and arrangement of the gas feed assembly 400, the microwave radiation assembly 600 and UV radiation assembly 700. The processing chamber body 110 can be formed of a material such as quartz, silicon carbide (SiC), stainless steel, or the like.

The processing chamber body temperature control assembly 150 is operated and controlled to heat or cool the processing space 140 to a desired temperature and to maintain the desired temperature. For example, the processing chamber body temperature control assembly 150 can include internal conduits arranged between the processing chamber body outer wall 120 and the processing chamber body inner wall 130 for circulating a heating or cooling medium there through to provide sufficient heating or cooling of the processing space 140. The processing chamber body temperature control assembly 150 can include one or more sensors for detecting the temperature at a corresponding one or more positions on the processing chamber body inner wall 130. The processing chamber body temperature control assembly 150 can include one or more pumps and valves that can be controlled and operated to circulate the heating or cooling medium through the internal conduits to heat or cool the processing space 140. In another example, the processing chamber body temperature control assembly 150 can include external conduits arranged externally of the processing chamber body 110 for circulating a heating or cooling medium there through to provide sufficient heating or cooling of the processing space 140.

Substrate Stage Assembly

The substrate stage assembly 200 can include a substrate stage 210, a driving part 220 and a substrate stage temperature control assembly 230.

The substrate stage 210 can be formed as a disk configured to be arranged in the processing space 140. The substrate stage 210 can include a substrate stage surface on which the substrate 20 is mounted. The dimensions of the substrate stage 210 are determined based on the dimensions of the processing space 140 and the dimensions of the substrate 20 mounted on the substrate stage surface. Further, the dimensions of the substrate stage 210 can be modified to accommodate the mounting of a plurality of substrates. The substrate stage 210 can be formed of a material such as quartz, ceramic, stainless steel, cermet, or the like, so as to endure the temperature and pressure atmospheres in the processing space 140.

The driving part 220 can include a substrate stage support 222 and a substrate stage driver 224. The substrate stage support 222 supports the substrate stage 210 in the processing space 140 such that the substrate stage surface is positioned on a plane at an adjustable height along the central Z-axis. The substrate stage support 222 can be formed as a shaft that penetrates the inner base wall 132 of the processing chamber body 110. Like the substrate stage 210, the substrate stage support 222 can also be formed of a material such as quartz, ceramic, stainless steel, cermet, or the like, so as to endure temperature and pressure atmospheres in the processing space 140. The substrate stage driver 224 can include a motor mechanism for rotating the substrate stage support 222 to rotate the substrate stage 210 about the central Z-axis and to move substrate stage support 222 along the central Z-axis to change the position of the substrate stage surface on the central Z-axis. The motor mechanism can be controlled and operated to rotate the substrate stage 210 and to change the position of substrate stage surface along the central Z-axis at an adjustable speed.

The substrate stage temperature control assembly 230 is configured to heat or cool the substrate stage 210 to thereby heat or cool the substrate 20 mounted on the substrate stage 210.

The substrate stage temperature control assembly 230 can include a resistance heater 232. The substrate stage 210 can be resistively heated by applying an electrical current from a power supply to the resistance heater 232. The substrate 20 is, in turn, heated by the substrate stage 210.

The substrate stage temperature control assembly 230 can include a heating or cooling medium circulation assembly 234 for circulating a heating or cooling medium through the substrate stage 210. The heating or cooling medium circulation assembly 230 can include an inlet, an outlet, one or more conduits in liquid communication with the inlet and the outlet, a temperature sensor, control valves and a pump. The one or more conduits can be embedded in the substrate stage 210 to allow for the flow of the heating or cooling medium, such as water, from the inlet to the outlet to heat or cool the substrate stage 210. The temperature sensor can be configured to sense the temperature of the substrate stage 210, the substrate 20, or both. The control valves and pump can be operated to control the flow of the heating or cooling medium through the inlet, the one or more conduits and the outlet to control the temperature of the substrate stage 210, the substrate 20, or both.

The substrate stage temperature control assembly 230 can be controlled and operated to heat the substrate stage 210 to a predetermined temperature range depending upon the process requirement. In a first example, in a process for deposition of polymeric substrates, the substrate stage temperature control assembly can be controlled to heat the substrate stage 210 to maintain a substrate temperature of lower than 100° C. In a second example, in a process for device fabrication, the substrate stage temperature control assembly 230 can be controlled and operated to heat the substrate 20 to maintain a substrate temperature of between 350° C. to 400° C.

Gas Feed Assembly

The gas feed assembly 400 is configured to feed one or more gases from one or more gas sources into the processing space 140. For example, the gas feed assembly 400 can be configured to feed one or more precursor gases, one or more reactive gases, one or more carrier gases, and one or more mixtures of precursor, reactive and carrier gases into the processing space 140.

Examples of precursor gases include hydrocarbons such as methane, ethane, ethylene, acetylene, propane, benzene and combinations thereof. Other examples of precursor gases include metal chlorides, metal hydrides, carbo-silanes, siloxanes, organosilicons and combinations thereof. The precursor gases can be used in combination with reactive gases such as hydrogen, ammonia, nitrous oxide, nitrogen, oxygen, ozone and the like for deposition. Examples of carrier gases include inert gases such as argon and helium.

The gas feed assembly 400 can be configured to feed one or more gases through a port which opens into the processing space 140. The gas feed assembly 400 can include a conduit 410 providing fluid communication between one or more gas sources 420 and the port opening into the processing space 140. The conduit 410 can be a manifold extending from the one or more gas sources 420. The gas feed assembly 400 can include one or more mass flow controllers 430 that can be controlled and operated to control the flow rate of the one or more gases through the conduit 410, and one or more shut off valves 440 to stop the flow of the one or more gases through the conduit 410.

In a first example, the port can be positioned in the inner side wall 136 of the processing chamber body 110 and relative to the microwave assembly 600 and the UV radiation assembly 700 such that the one or more gases fed into the processing space 140 can be coupled to the microwave radiation generated by the microwave assembly 600 and the UV radiation generated by the UV radiation assembly 700.

In a second example, the port can be positioned in the inner top wall 134 of the processing chamber body 110 above the substrate 20. A showerhead can be arranged downstream of and be connected to the port to distribute the one more gases fed into the processing space 140.

In a third example, the gas feed assembly 400 can include a ring-shaped conduit 410 arranged to be aligned around the central Z-axis. The ring-shaped conduit 410 provides fluid communication between the one or more gas sources 420 and a plurality of ports 412 distributed along the inner side wall 136 of the processing chamber body 110.

In the third example, the gas feed assembly 400 can be configured to feed one more gases through a plurality of ports which open into the processing space 140. The plurality of ports can be divided into a plurality of groups, wherein gas feed through each group of ports can be separately controlled. For example, a precursor gas or a mixture of a precursor gas and a carrier gas can be fed through a first group of the plurality of ports into the processing space 140, and a reactive gas or a mixture of a reactive gas and a carrier gas can be fed through a second group of the plurality of ports into the processing space 140.

In the third example, the plurality of ports can be distributed uniformly along the circumference of the inner side wall 136 of the processing chamber body 110 at a single height along the central Z-axis or at variable heights along the central Z-axis. The distributed arrangement of the plurality of ports can increase uniformity of the one or more gases in the processing space 140.

In a fourth example, the gas feed assembly 400 can include one or more conduits 410 configured to extend past the processing chamber body inner wall 130 of the processing chamber body 110 into the processing space 140. The portion of the one or more conduits 410 extending into the processing space 140 can be configured to extend and retract to position the one or more ports arranged at an end of the one or more conduits 410 within the processing space 140. Specifically, the portion of the one or more conduits 410 extending into the processing space 140 can include a coaxial inner conduit and outer conduit where the port is arranged on the inner conduit and the inner conduit can move relative to the outer conduit to position the port at a variable position along the central Z-axis.

Vacuum Assembly

The vacuum assembly 300 can include a vacuum pump 310 that is operated and controlled to evacuate the processing space 140 through a duct to a pressure suitable for depositing material on the substrate 20. The duct can be arranged in the inner base wall 132 of the processing chamber body 110. The vacuum assembly 300 can include a plurality of ducts arranged in the inner base wall 132 of the processing chamber body 110. The plurality of ducts can be arranged around the central Z-axis to provide a predetermined distance between each of the plurality of ducts. The plurality of ducts are fluidly communicated with the vacuum pump 310. The vacuum assembly 300 can further include a throttle valve on the pump inlet to regulate the pumping speed and the pressure in the processing chamber 100. The vacuum assembly 300 can further include a trap for collecting unreacted precursor material and reaction by-product from the processing space 140.

Excitation Assembly

The excitation assembly 500 includes the microwave radiation assembly 600 and the UV radiation assembly 700.

The microwave radiation assembly 600 generates microwave radiation and emits the microwave radiation into the processing space 140. The UV radiation assembly 700 generates UV radiation and emits the UV radiation into the processing space 140. The microwave radiation assembly 600 and the UV radiation assembly 700 will be described in further detail below.

The microwave radiation assembly 600 and the UV radiation assembly 700 can be independently controlled and operated. As will be described in further detail below, the microwave radiation assembly 600 and the UV radiation assembly 700 can be controlled and operated in sequence or simultaneously.

In the first embodiment of the present invention, a portion or all of the processing space 140 acts as an excitation space into which reactive gas is fed. For example, a portion of the processing space 140 above the substrate 20 can act as the excitation space. The microwave radiation assembly 600 and the UV radiation assembly 700 are operated in combination to emit microwave radiation and UV radiation into the excitation space to form activated species including radicals, ions and other excited species via application or coupling of energy from the microwave radiation and UV radiation to the reactive gas.

Although not wishing to be bound by any particular theory, it is thought that UV radiation generated by the UV radiation assembly 700 may promote the formation of activated species of one or more reactive gases so that a smaller field intensity of the microwave radiation generated by the microwave radiation assembly 600 is sufficient to excite the plasma. Microwave plasma enhanced chemical vapor deposition will generate a plasma ball source of highly dense reactive species without the ion bombardment onto the substrate. The microwave energy source is intended to generate plasma of reactive gases broken down in specific dissociative reaction pathway and until the more complex downstream deposition chemistries occur. The low power microwave plasma will dissociate the reactants and generate a high number of low energy reactive species that lead to specific reaction pathways. The additional UV radiation will enhance the dissociation and reaction of the reaction species to a specific and stable reaction pathway that enhance the growth of high quality film (diamond is an example) on the substrate surface without the normally high thermal energy required. This will lower the deposition temperature, increase the deposition rate and enhance the deposited film's quality, properties and performance.

Microwave Radiation Assembly

The microwave radiation assembly 600 can include a microwave power source 610 and a microwave applicator 630.

In a first example, the microwave power source 610 can include a magnetron 612 or other known devices for generating microwave radiation at a frequency sufficient to excite the one or more gases fed to the processing space 140 by the gas feed assembly 400. The microwave power source 610 can include a coupling means 614 including a circulator and a tuner.

In the first example, the microwave applicator 630 can include a waveguide, a microwave horn antenna arranged to the processing chamber body 110 and a dielectric window to cover the aperture of the microwave horn antenna and to be in contact with the inner wall 130 of the processing chamber body 110 to seal the processing space 140. The waveguide can be a coaxial, cylindrical, or rectangular waveguide. The dielectric window can be formed of a mixed glass, quartz, or ceramic seal plate. The microwave applicator 630 can be positioned in the inner side wall 136 or the inner top wall 134 of the processing chamber body 110. Microwave radiation generated by the microwave power source 610 is propagated by the microwave applicator 630 and emitted through the dielectric window into the processing space 140.

In a second example, the microwave radiation assembly 600 can include a plurality of microwave power sources 610 and a corresponding plurality of microwave applicators 630. The plurality of microwave applicators 630 can include a plurality of microwave horn antennas arranged to the processing chamber body 110, and a corresponding number of dielectric windows to cover the apertures of the microwave horn antennas.

In the second example, the plurality of microwave horn antennas can be positioned in the inner side wall 136, the inner top wall 134, or both the inner side wall 136 and the inner top wall 134 of the processing chamber body.

In the second example, a plurality of microwave horn antennas can be arranged around the circumference of the inner side wall 136 with a predetermined distance provided between each microwave horn antenna. The plurality of microwave horn antennas can be arranged at a single height along the central Z-axis. Alternatively, the plurality of microwave horn antennas can be arranged at a plurality of heights along the central Z-axis.

In a third example, the microwave applicator 630 can include a plurality of microwave horn antennas arranged to the processing chamber body 110, and a corresponding number of dielectric windows to cover the apertures of the microwave horn antennas. The plurality of microwave horn antennas can be positioned in the inner side wall 136, the inner top wall 134, or both the inner side wall 136 and the inner top wall 134 of the processing chamber body 110. The plurality of microwave horn antennas can be grouped into arrays and each array of microwave horn antennas is connected via a waveguide to an independently controlled and operated microwave power source 610.

In the above-described examples, the one or more microwave horn antenna can be replaced with another type of antenna, such as, a microwave slotted aperture antenna and a microwave leaky waveguide mode antenna.

Figure 3:
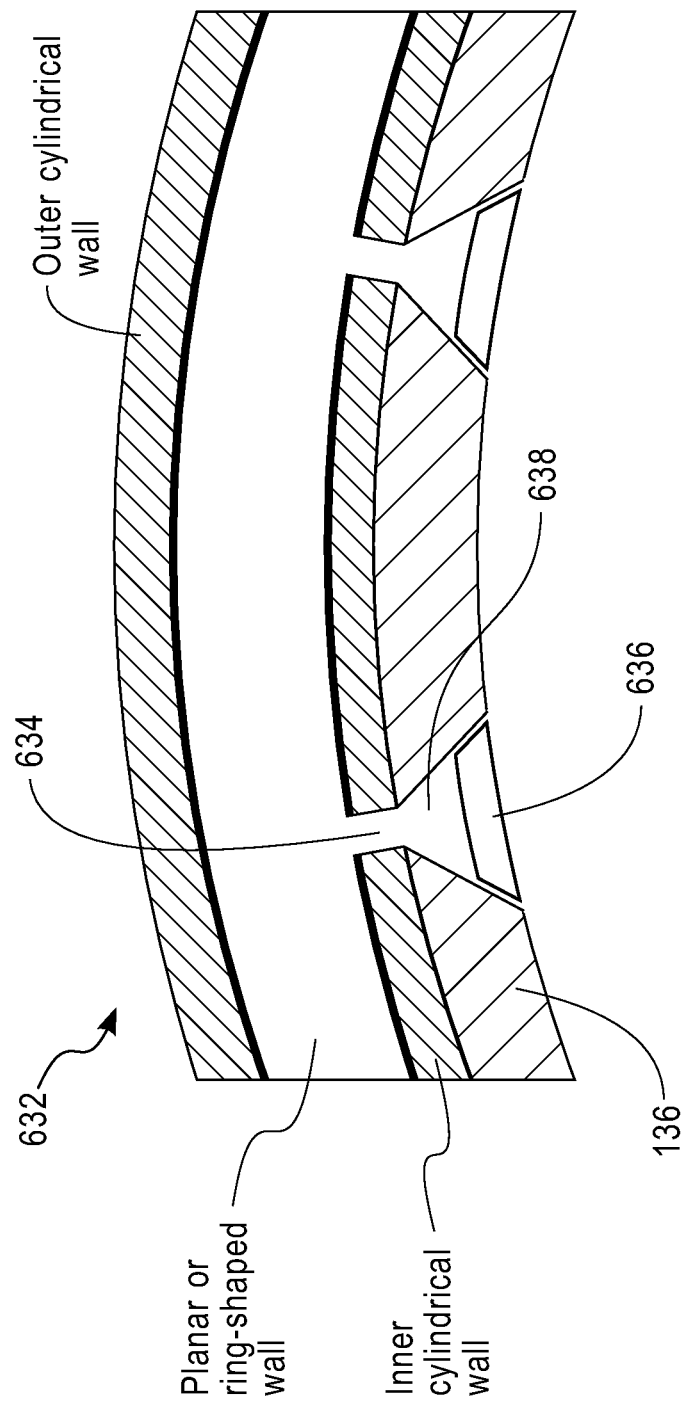
FIG. 3 illustrates a microwave waveguide according to the first embodiment of the present invention.

In a fourth example, the microwave applicator 630, as shown in FIG. 3, can include an annular waveguide 632 having a surface provided with a plurality of slots 634 for radiating microwave radiation, and a dielectric window 636 that seals the inside of the processing space 140. The annular waveguide 632 can be arranged to the inner side wall 136 of the processing chamber body 110. The annular waveguide 632 can include an outer cylindrical wall, an inner cylindrical wall, and planar or ring-shaped walls connecting the outer cylindrical wall and the inner cylindrical wall. The inner cylindrical wall can include a plurality of slots 634 arranged to be equidistant from one another in a radial direction along the central Z-axis. A cylindrical dielectric window can be provided between the inner cylindrical wall of the annular waveguide 632 and the processing chamber body 110 to seal the processing space 140 while allowing microwave radiation to pass there through. Alternatively, a plurality of dielectric windows 636 can be provided between the slots 634 of the inner cylindrical wall of the annular waveguide 632 to seal the processing space 140 while allowing microwave radiation to pass there through. Further, as illustrated in FIG. 3, an aperture formed in the inner wall 130 of the processing chamber body 110 to connect the dielectric window 636 and the slot 634 of the annular waveguide 632 can be formed as a horn antenna 638.

Figure 4:
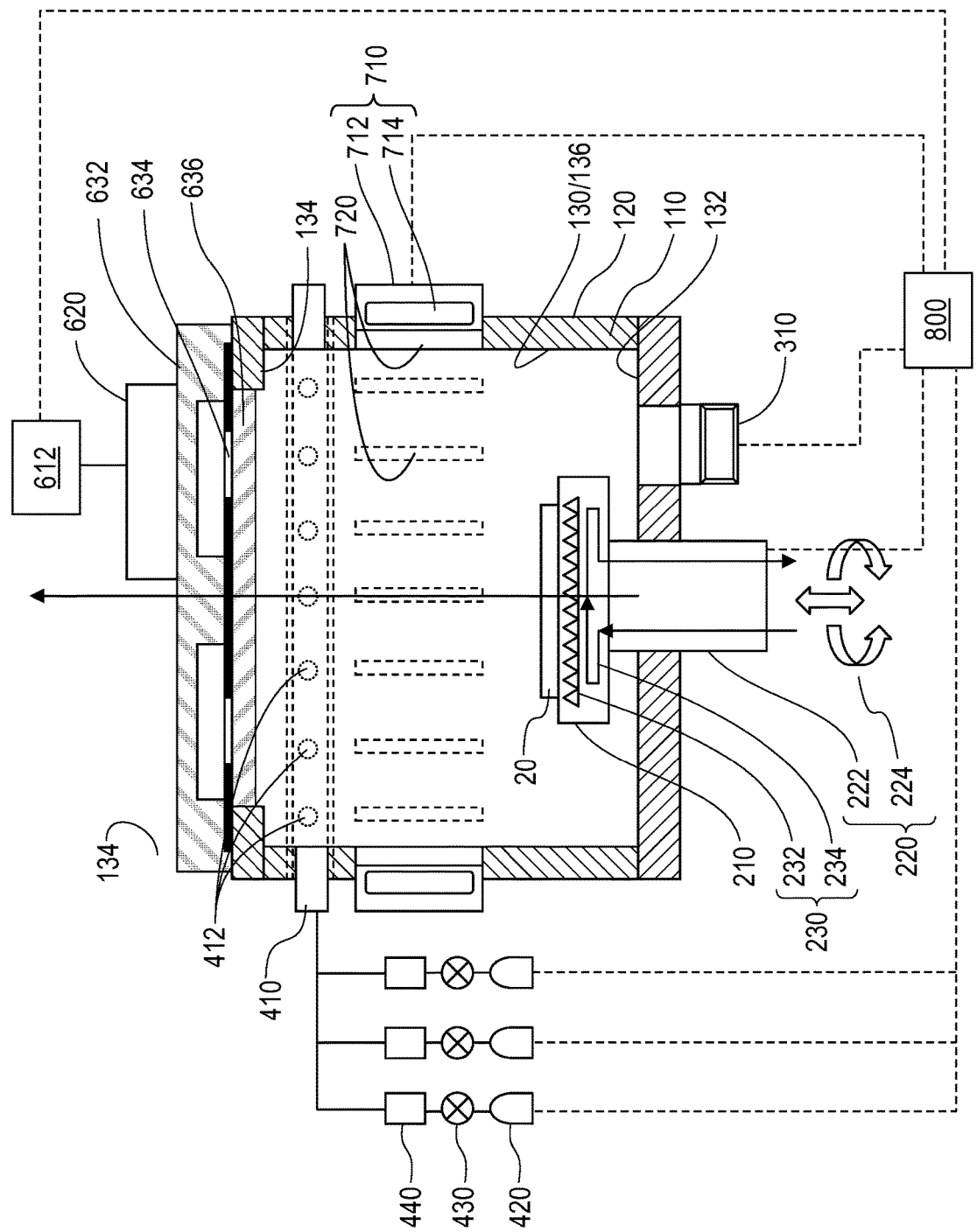
FIG. 4 is another schematic diagram of the deposition apparatus with a second configuration of the excitation assembly according to the first embodiment of the present invention.

In a fifth example, an annular waveguide 632 can be arranged to the inner top wall 134 of the processing chamber body 110 as illustrated in FIG. 4. The annular waveguide 632 is provided with a plurality of slits 634 such that microwave radiation generated by the microwave power source 610 and introduced into the annular waveguide 632 is emitted through the plurality of slits 634 into the processing space 140. The plurality of slits 634 can be arranged to be equidistant from one another in a radial direction along central Z-axis. A dielectric window 636 can be provided between the annular waveguide 632 and the processing space 140 to seal the processing space 140 while allowing microwave to pass there through. It is possible to provide other patterns of slit or slits to the annular waveguide 632. For example, a spiral slit can be provided to the annular waveguide 632. The width and pitch of the spiral slit can be set to promote uniform intensity distribution of the radiated microwave.

UV Radiation Assembly

The UV radiation assembly 700 can include a UV source unit 710, an optical window 720, and a movable protective shutter 730.

The UV source unit 710 includes a UV source housing 712 and a UV source 714 arranged in the interior space of the UV source housing 712 for emitting UV radiation into the processing space 140 of the processing chamber body 110.

A first example of the UV radiation assembly 700 will be described with reference to FIG. 2. The UV source housing 712 can be mounted and connected to the inner top wall 134 of the processing chamber body 110. The UV source 714 is configured to generate and emit UV radiation through an opening, provided to connect the interior space of the UV source housing 712 and the processing space 140 of the processing chamber body 110, into the processing space 140. The UV source 714 is configured and arranged to direct UV radiation generally uniformly along the central Z-axis into the processing space 140 and in the direction of the substrate stage 210 and the inner base wall 132 of the processing chamber body 110. The interior surface of the UV source housing 712 can be coated in reflective material to reflect UV radiation into the processing space 140.

In the first example of the UV radiation assembly 700 where the UV source housing 712 is mounted and connected to the inner top wall 134 of the processing chamber body 110, the microwave applicator 630 of the microwave radiation assembly 600 can be arranged on the inner side wall 136 of the processing chamber body 110. As illustrated in FIG. 2, the microwave applicator 630 can include the annular waveguide 632, described above, wherein the annular waveguide 632 can be arranged to the inner side wall 136 of the processing chamber body 110. Other configurations described above in which the microwave applicator 630 is arranged to the inner side wall 136 of the processing chamber body 110 can also be implemented and are within the scope of the present invention.

In the first example, the optical window 720 is mounted to the UV source housing 712 and provided between the UV source 714 and the inner base wall 132 of the processing chamber body 110. The optical window 720 consists of a material selected based on the UV wavelength to be directed into the processing space 140. Examples of materials selected for the optical window 720 include quartz, magnesium fluoride, and calcium fluoride. In an example, the optical window 720 can be formed as a lens for focusing the UV radiation to a portion of the processing space 140. The UV source 714 is housed air-tightly by the optical window 720 and the UV source housing 712.

In the first example, the protective shutter 730 is provided to move between a first position aligned with the central Z-axis and a second position that is not aligned with the central Z-axis. In the first position, the protective shutter 730 covers the optical window 720 when the UV radiation assembly 700 is not operated. The protective shutter 730 may be positioned by, for example, a handle or by a computer-controlled positioning mechanism.

A second example of the UV radiation assembly 700 will be described with reference to FIG. 4. A plurality of UV source housings 712 can be mounted and connected to the inner side wall 136 of the processing chamber body 110. The UV source housings 712 can be arranged radially along the circumference of the inner side wall 136 to be equidistant from one another in a radial direction along central Z-axis. The UV source 714 provided in each of the plurality of UV source housings 712 are configured to emit UV radiation through an opening, provided to connect the interior space of each UV source housing 712 and the processing space 140 of the processing chamber body 110, into the processing space 140. The UV source 714 can be configured and arranged to direct UV radiation to a predetermined position along the central Z-axis in the processing space 140 above the substrate 20 and the substrate stage 210.

In the second example of the UV radiation assembly 700 where the UV source housing 712 is mounted and connected to the inner side wall 136 of the processing chamber body, the microwave applicator 630 of the microwave radiation assembly 600 can be arranged to the inner top wall 134 of the processing chamber body. As illustrated in FIG. 4, the microwave applicator 630 can include the annular waveguide 632, described above, wherein the annular waveguide 632 can be arranged to the inner top wall 134 of the processing chamber body 110. Other configurations described above in which the microwave applicator 630 is arranged to the inner top wall 134 of the processing chamber body can also be implemented and are within the scope of the present invention.

The UV source 714 described in the first and second examples can include one or more UV lamps that can be individually or collectively controlled to emit UV radiation sufficient to provide activation energy to excite and/or dissociate a reactive gas fed by the gas feed assembly 400 into the processing space 140. The UV source 714 can include, for example, one or more deuterium lamps.

The UV source 714 can be configured to allow a first set of UV lamp (or UV lamps) to be exchanged for a second set of UV lamp (or UV lamps), wherein the first set of UV lamp(s) has a first frequency spectrum, and the second set of UV lamp(s) has a second frequency spectrum different from the first frequency spectrum.

Controller

The controller 800 can be communicatively connected to control one or more of the processing chamber 100, the substrate stage assembly 200, the vacuum assembly 300, the gas feed assembly 400, and the excitation assembly 500 including the microwave assembly 600 and the UV radiation assembly 700.

The controller 800 and other aspects of the present invention can be implemented as a program, software, or computer instructions embodied in a computer or machine usable or readable device, which causes the computer or machine to perform the steps of the instructions when executed on the computer or machine. A computer or machine usable or readable device can include any tangible or physical medium that can store data and/or computer instructions, and, for example, that can be read and/or be executed by a computer, machine or the like. Examples of a computer or machine usable or readable device can include but are not limited to, memory devices (such as a random access memory (RAM), a read-only memory (ROM) and the like), discs, optical storage devices, and others.

The controller 800 and other aspects of the present disclosure above may be implemented on a computer system. The computer system may be of any type of known or will be known systems and may typically include a hardware processor, memory device, a storage device, input/output devices, internal buses, and/or a communications interface for communicating with other computer systems in conjunction with communication hardware and software and so on.

The terms "computer system" as used in the present disclosure may include a variety of combinations of fixed and/or portable computer hardware, peripherals, and software components stored on storage devices. The computer system may include a plurality of individual components that are networked or otherwise linked to perform collaboratively, or may include one or more stand-alone components. The hardware and software components of the computer system of the present application may include and may be included within fixed and portable devices such as a desktop, a laptop or a server.

Method of Use of Deposition Apparatus

Figure 5:
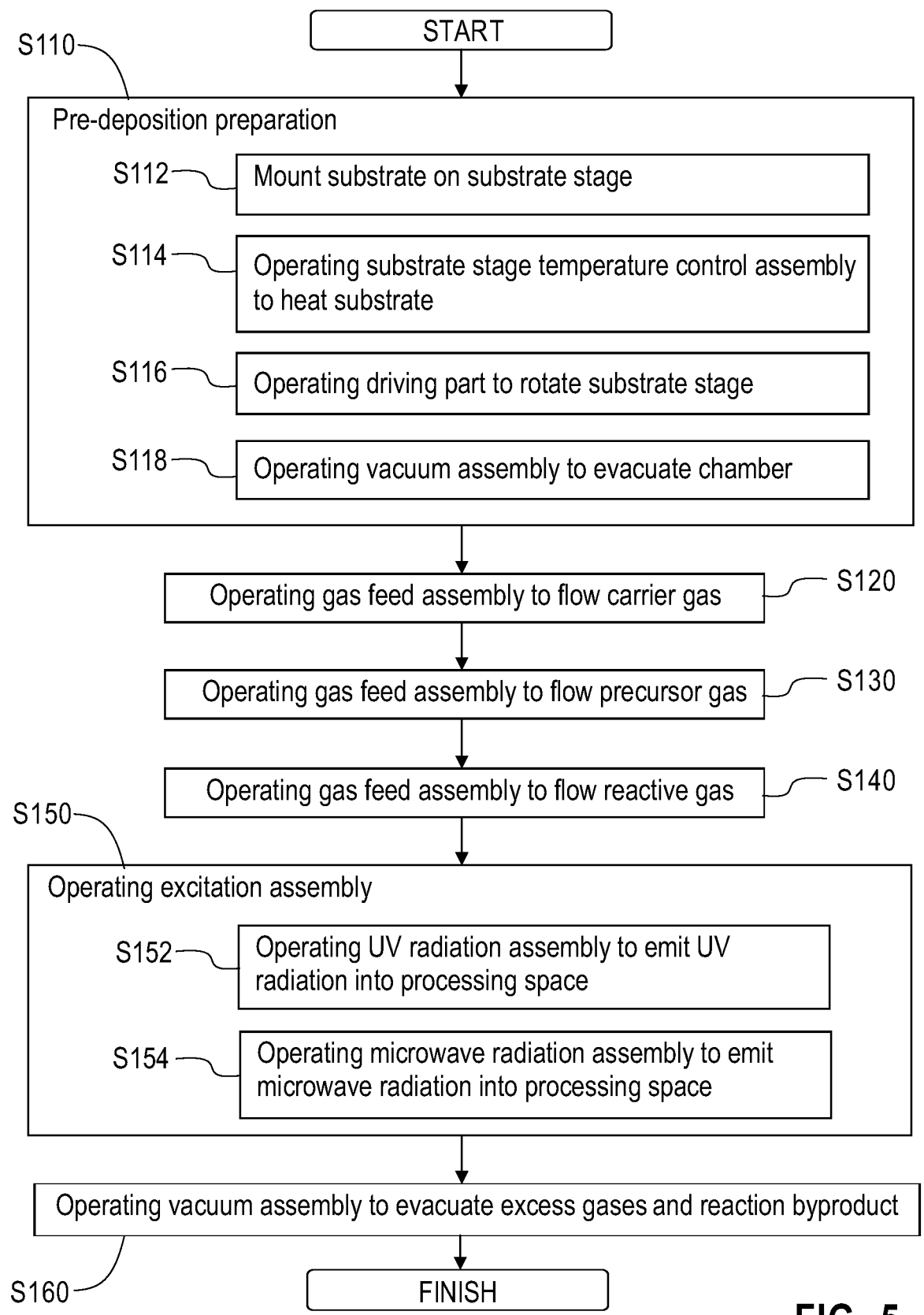
FIG. 5 is a flowchart showing a method of using a deposition apparatus according to second embodiment of the present invention.

A method of using the deposition apparatus 10 according to a second embodiment of the present invention will be described below with reference to FIG. 5.

In step S110, pre-deposition preparation is performed. Pre-deposition preparation can include: a step S112 of mounting one or more substrates on the substrate stage 210 within the processing space 140; a step S114 of controlling and operating the substrate stage temperature control assembly 230 to heat the substrate 20 to a suitable temperature and to maintain the temperature; a step S116 of controlling and operating the driving part 220 to rotate the substrate stage 210 at a suitable speed and to adjust the height of the substrate stage 210 along the central Z-axis; and a step S118 of controlling and operating the vacuum assembly 300 to evacuate the processing space 140 to a pressure suitable for depositing the desired material on the substrate 20 and to maintain the pressure.

In step S120, the gas feed assembly 400 is controlled and operated to establish a suitable flow of a carrier gas A through one or more ports in the processing chamber body 110 and into the processing space 140. In step S130, the gas feed assembly 400 is controlled and operated to establish a suitable flow of a precursor gas B through one or more ports in the processing chamber body 110 and into the processing space 140 to form a saturated layer on the surface of the substrate 20. In step S140, the gas feed assembly 400 is controlled and operated to establish a suitable flow of reactive gas C through one or more ports of the processing chamber body 110 and into the processing space 140.

In step S150, the excitation assembly 500 is controlled and operated to excite reactive gas C in the processing space 140. Step S150 can include: step S152 of controlling and operating the UV radiation assembly 700 to generate UV radiation and to emit UV radiation into the processing space 140 to excite the reactive gas C; and step S154 of controlling and operating the microwave radiation assembly 600 to generate microwave radiation and to emit the microwave radiation into the processing space 140 to excite the reactive gas C. In Step S150, the microwave radiation assembly 600 and the UV radiation assembly 700 can be controlled to tune the excitation conditions such that primarily or only the reactive gas C is excited.

Steps S120-150 can be repeated to form compound thin films of a desired thickness.

In step S160, after the operation of steps S120-150 have been stopped, the vacuum assembly 300 can be controlled and operated to evacuate excess gases and reaction byproduct.

The method of using the deposition apparatus 10 for material deposition may omit some of the recited steps. For example, step S114 of controlling and operating the substrate stage temperature control assembly 230 to heat the substrate 20 to a suitable temperature and to maintain the temperature, and step S116 of controlling and operating the driving part 220 to rotate the substrate stage 210 at a suitable speed may be omitted.

Further, the method of using the deposition apparatus 10 for material deposition is not limited by the recited order of the steps. In one example, the order in which steps S112-S118 are performed can be changed. In another example, one or more of steps S112-S118 can be performed sequentially or simultaneously.

Still further, the method of using the deposition apparatus 10 for material deposition can include operating and controlling the microwave radiation assembly 600 and the UV radiation assembly 700 in steps S152 and S154 in various process sequences.

Figure 6:
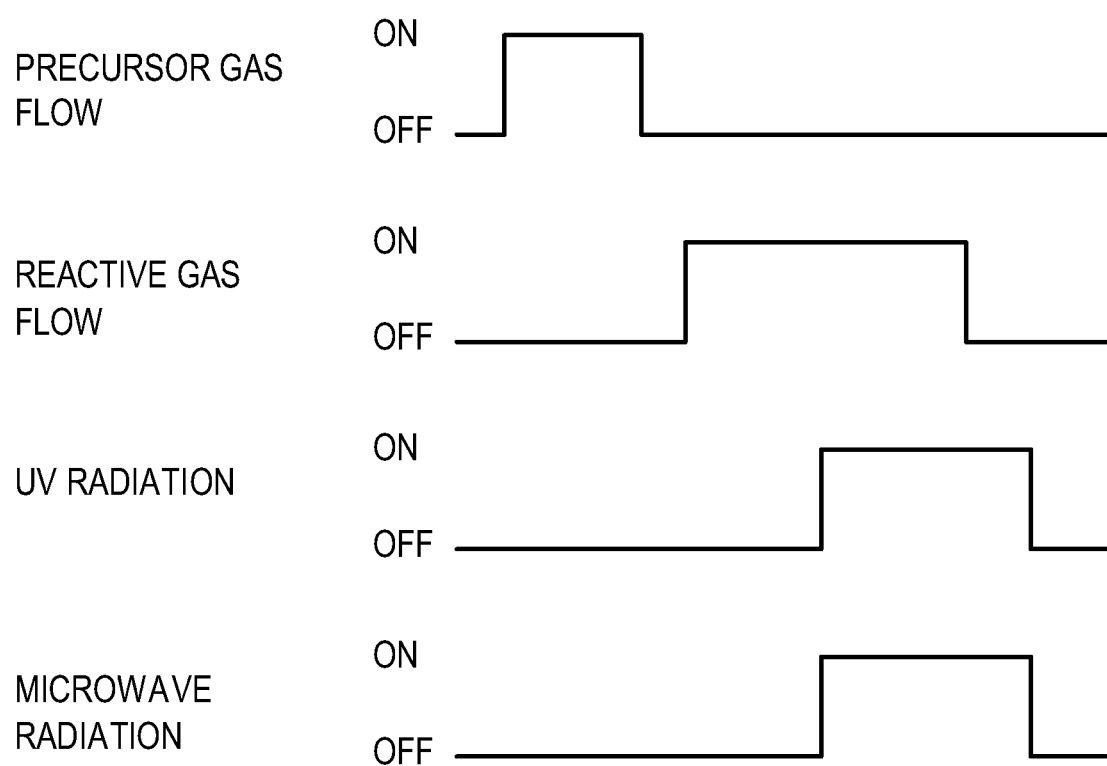
FIG. 6 shows a first exemplary process sequence for operating and controlling a microwave radiation assembly and an ultraviolet (UV) radiation assembly according to the second embodiment of the present invention.

FIG. 6 shows a first exemplary process sequence for operating and controlling the microwave radiation assembly 600 and the UV radiation assembly 700. First, a precursor gas flows in a pulse, and then, a reactive gas flows in a pulse. During the flow of the reactive gas, the microwave radiation assembly 600 and the UV radiation assembly 700 are operated. In the first exemplary process sequence, the microwave radiation assembly 600 and the UV radiation assembly 700 are operated simultaneously for a predetermined period.

Figure 7:
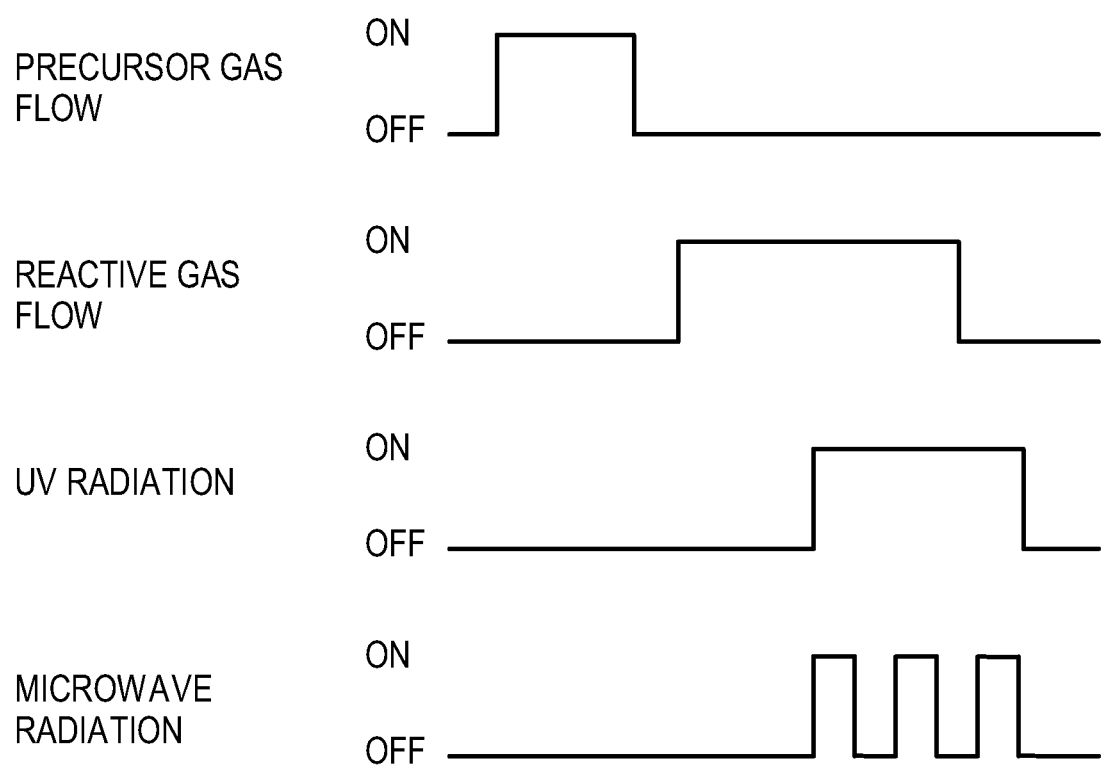
FIG. 7 shows a second exemplary process sequence for operating and controlling the microwave radiation assembly and the UV radiation assembly according to the second embodiment of the present invention.

FIG. 7 shows a second exemplary process sequence for operating and controlling the microwave radiation assembly 600 and the UV radiation assembly 700. First, a precursor gas flows in a pulse, and then, a reactive gas flows in a pulse. During the flow of the reactive gas, the microwave radiation assembly 600 and the UV radiation assembly 700 are operated. In the second exemplary process sequence, the UV radiation assembly 700 is operated for a predetermined period, and the microwave radiation assembly 600 is operated with pulse-time-modulation.

Figure 8:
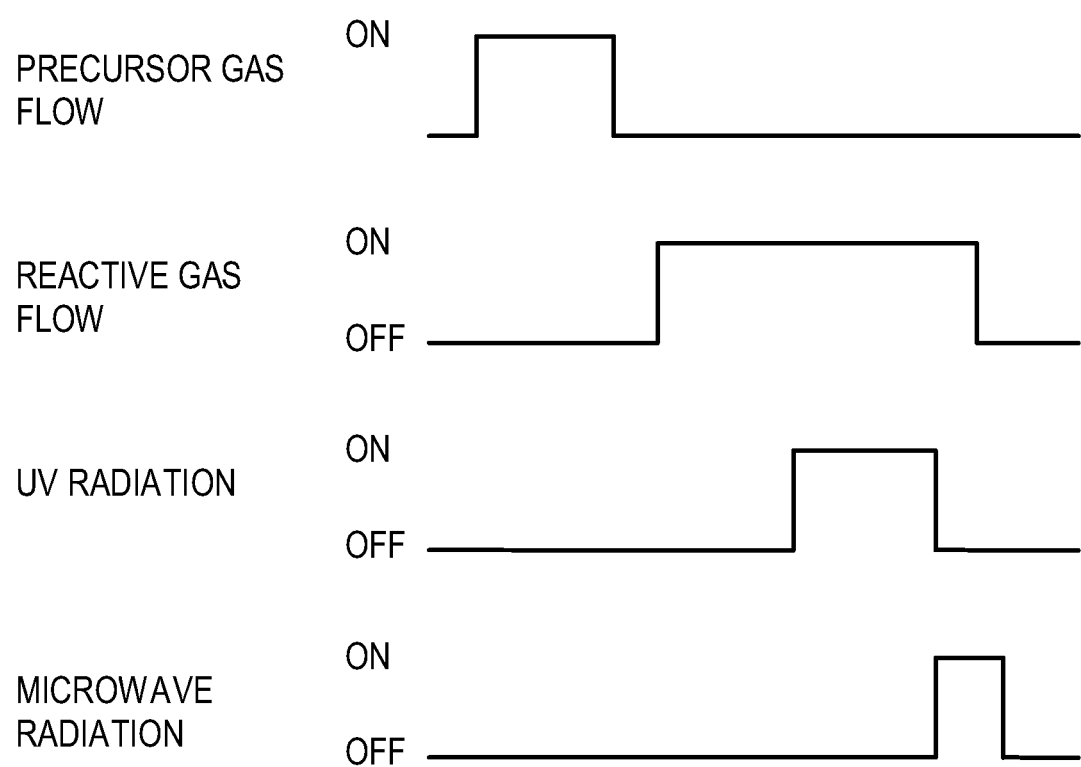
FIG. 8 shows a third exemplary process sequence for operating and controlling the microwave radiation assembly and the UV radiation assembly according to the second embodiment of the present invention.

FIG. 8 shows a third exemplary process sequence for operating and controlling the microwave radiation assembly 600 and the UV radiation assembly 700. First, a precursor gas flows in a pulse, and then, a reactive gas flows in a pulse. During the flow of the reactive gas, the microwave radiation assembly 600 and the UV radiation assembly 700 are operated. In the third exemplary process sequence, the UV radiation assembly 700 and the microwave radiation assembly 600 are operated in sequence, with the operation of the UV radiation assembly 700 preceding the operation of the microwave radiation assembly 600. Alternatively, in the third exemplary process sequence, the operation of the microwave radiation assembly 600 can precede the operation of the UV radiation assembly 700.

The method of using the apparatus 10 can further include a plurality of cycles, wherein each cycle includes a pulse of precursor gas, a pulse of reactive gas, and one or more of the above-described sequences for operating the microwave radiation assembly 600 and the UV radiation assembly 700.

The method of using the apparatus 10 for material deposition can further include the controller 800 controlling one or more of the processing chamber 100, the substrate stage assembly 200, the vacuum assembly 300, the gas feed assembly 400, and the excitation assembly 500 including the microwave assembly 600 and the UV radiation assembly 700 in performing the above-described steps.

A first example of the method of using the apparatus 10 for forming a layer of titanium on a silicon substrate will be described.

In step S110, pre-deposition preparation is performed. Step S110 can include: step S112 in which the silicon substrate is mounted on the substrate stage 210 within the processing space 140; step S114 in which the substrate stage temperature control assembly 230 is controlled and operated to heat the silicon substrate; step S116 in which the driving part 220 is controlled and operated to elevate the substrate stage 210 to a suitable height and to rotate the substrate stage 210 at a suitable speed; and step S118 in which the vacuum assembly 300 is controlled and operated to evacuate the processing space 140 to a suitable pressure.

In step S120, the gas feed assembly 400 is controlled and operated to establish a suitable flow of carrier gas A through one or more ports into the processing space 140.

In step S130, the gas feed assembly 400 is controlled and operated to establish a suitable flow of a precursor gas of titanium tetrachloride ($TiCl_4$) through one or more ports into the processing space 140. After S130, the $TiCl_4$ gas molecules are adsorbed onto the surface of the substrate and a saturated layer of $TiCl_4$ is formed. In a modification of the method 100, the microwave radiation assembly 600 can be controlled and operated to emit microwave radiation and the UV radiation assembly 700 can be controlled and operated to emit UV radiation to pre-treat the surface of the substrate to promote adsorption of $TiCl_4$ gas molecules.

In step S140, the gas feed assembly 400 is controlled and operated to establish a suitable flow of a reactive gas of hydrogen ($H_2$) gas through one or more ports into the processing space 140.

In step S152, the UV radiation assembly 700 is controlled and operated to emit UV radiation to break the bonds of the $H_2$ molecule, making the hydrogen atoms available to react with the chlorine atoms in the saturated layer. The UV radiation also breaks the bonds between the chlorine atoms and the titanium atoms allowing the chlorine to react freely with the hydrogen. The hydrogen and chlorine react to form a reaction byproduct that is evacuated in step S160. In step S154, the microwave radiation assembly 600 is controlled and operated to supply microwave energy from the magnetron to ionize the hydrogen gas to generate hydrogen ions ($H^+$) which reacts with the chlorine atoms in the saturated layers to form hydrogen chloride. Hydrogen chloride is a reaction byproduct that is exhausted out of the processing space 140 in step S160.

Following step S150, including steps S152 and S154, a titanium layer results. Steps S152 and S154 can be performed simultaneously or in sequence.

A second example of the method of using the apparatus 10 for forming a layer of titanium nitride on a silicon substrate will be described.

In step S110, pre-deposition preparation is performed. Step S110 can include: step S112 in which the silicon substrate is mounted on the substrate stage 210 within the processing space 140; step S114 in which the substrate stage temperature control assembly 230 is controlled and operated to heat the silicon substrate; step S116 in which the driving part 220 is controlled and operated to elevate the substrate stage 210 to a suitable height and to rotate the substrate stage 210 at a suitable speed; step S118 in which the vacuum assembly 300 is controlled and operated to evacuate the processing space 140 to a suitable pressure.

In step S120, the gas feed assembly 400 is controlled and operated to establish a suitable flow of carrier gas A through one or more ports into the processing space 140. In step S130, the gas feed assembly 400 is controlled and operated to establish a suitable flow of a precursor gas of titanium tetrachloride ($TiCl_4$) through one or more ports into the processing space 140. The $TiCl_4$ gas molecules are adsorbed onto the surface of the substrate and a saturated layer of $TiCl_4$ is formed. In step S140 the gas feed assembly 400 is controlled and operated to establish a suitable flow of a reactive ammonia ($NH_3$) gas through one or more ports into the processing space 140.

In step S152, the UV radiation assembly 700 is controlled and operated to emit UV radiation to dissociate the chlorine atoms from the titanium atoms. The $NH_3$ gas reacts with the titanium to form a titanium nitride layer. In step S154, the microwave radiation assembly 600 is controlled and operated to emit microwave radiation to dissociate the bonds between the nitrogen and hydrogen atoms of the $NH_3$ gas and the chlorine and titanium atoms of the $TiCl_4$ gas. The titanium atoms react with the nitrogen atoms to form a saturated layer of titanium nitride. Steps S152 and S154 can be performed simultaneously or in sequence.

Method of Use of Deposition Apparatus to Form Diamond Type Carbon Films

Figure 9:
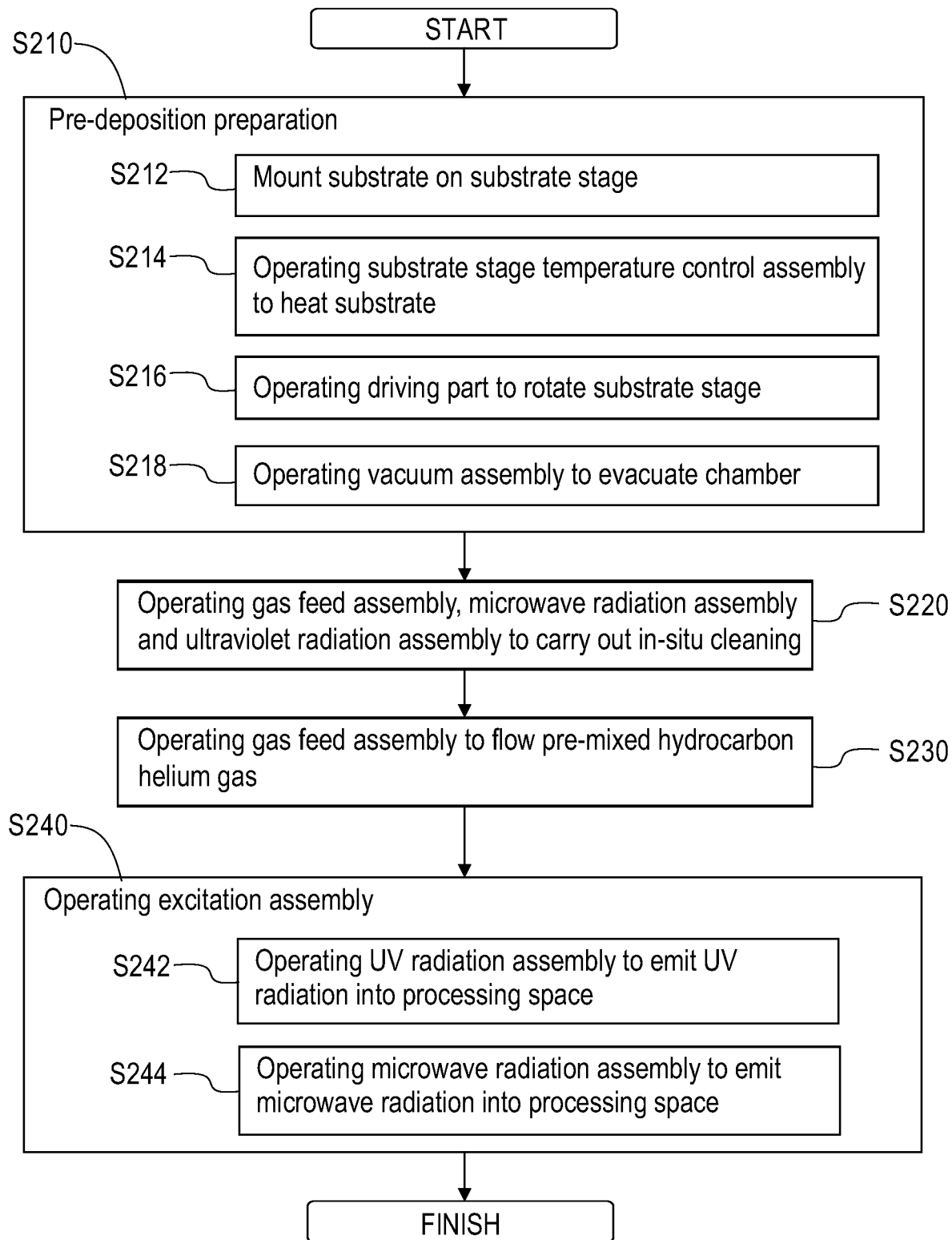
FIG. 9 is a flowchart showing a method of using a deposition apparatus according to a third embodiment of the present invention.

Next, a method of synthesizing a diamond type carbon film on a substrate using the deposition apparatus 10 from an admixture of a hydrocarbon with hydrogen according to a third embodiment of the present invention will be described with reference to FIG. 9.

Suitable substrates which can be coated with the diamond type carbon film include materials such as plastics, metals, various types of glass, magnetic heads, electronic chips, electronic circuit boards, semiconductor devices and the likes thereof. The substrate to be coated can be any shape or size provided that the substrate can be placed into the processing space 140 and mounted to the substrate stage 210. Thus, regular or irregular shape objects having any dimension can be used.

In step S210, pre-deposition preparation is performed. Pre-deposition preparation can include: a step S212 of mounting one or more substrates on the substrate stage 210 within the processing space 140; a step S214 of controlling and operating the substrate stage temperature control assembly 230 to heat the substrate 20 to a suitable temperature and to maintain the temperature; a step S216 of controlling and operating the driving part 220 to rotate the substrate stage 210 at a suitable speed and to adjust the height of the substrate stage 210 along the central Z-axis; and a step S218 of controlling and operating the vacuum assembly 300 to evacuate the processing space 140 to a pressure suitable for depositing diamond type carbon film on the substrate 20 and to maintain the pressure.

In step S214, the substrate stage temperature control assembly 230 is controlled and operated to heat the substrate 20 to a temperature suitable for a depositing diamond type carbon film and compatible with the substrate 20. For example, the substrate stage temperature control assembly can be operated and controlled to heat the substrate 20 to about 25° C. to 400° C. In a preferred embodiment, the substrate 20 is heated to a temperature from about 200° C. to 300° C. Most preferably, the substrate 20 is heated to a temperature of about 200° C. As part of step S240, the substrate stage temperature control assembly 230 is controlled and operated to hold the temperature of the substrate 20 constant throughout the deposition process.

In step S218, the vacuum assembly 300 is controlled and operated to evacuate the processing space 140 to a pressure suitable for depositing diamond type carbon film on the substrate 20. For example, the vacuum assembly 300 is controlled and operated to evacuate the processing space 140 to $10^{-4}$ to $10^{-7}$ Torr.

Then, in step S220, depending on the type of substrate used, one or more of the gas feed assembly 400, microwave radiation assembly 600, and the UV radiation assembly 700 can be controlled and operated to subject the substrate to in-situ plasma cleaning prior to depositing the diamond type carbon film. Suitable cleaning techniques employed may include $H_2$, Ar, $O_2$, $N_2$ and NH3 plasma/UV/thermal sputter etching techniques.

After achieving and maintaining the desired substrate temperature, in step S230, the gas feed assembly 400 is operated and controlled to feed a pre-mixed hydrocarbon hydrogen gas mixture into the processing space 140. The hydrocarbon gas which may be used may be any hydrocarbon compound which is first capable of being gaseous and then able to form a plasma at the reaction condition employed. The term hydrocarbon implies that the molecules which make up the compound contains only carbon and hydrogen atoms. Saturated or unsaturated hydrocarbon compounds may be employed by the method 200. A saturated hydrocarbon compound is a compound whose molecules contain only carbon single bonds while an unsaturated compound is a compound whose molecules contain carbon double or triple bonds. Suitable hydrocarbons contemplated by the method 200 include alkanes, alkenes and alkynes.

Alkanes are compounds having molecules containing only single bonds between carbon atoms. Suitable alkanes which may be employed by the above-described method of synthesizing a diamond type carbon film on a substrate include compounds such as methane, ethane, propane, butane and the like thereof. Of these alkanes, methane is most particularly preferred.

Alkenes are compounds having molecules containing a carbon-carbon double bond. Suitable alkene compounds which may be employed by the above-described method of synthesizing a diamond type carbon film on a substrate include compounds such as ethene, propene, n-butene and the like thereof.

Alkyne compound is a hydrocarbon whose molecules contain a carbon-carbon triple bond. Suitable alkynes which may be employed by the above-describe method of synthesizing a diamond type carbon film on a substrate include acetylene, propylene, 1-butylene, 2-butylene and the like thereof. Of these alkynes, acetylene is most particularly preferred.

In a preferred embodiment, acetylene is used as the hydrocarbon gas in forming the diamond type carbon film. Additionally, mixtures of hydrocarbon gases such as acetylene/methane may also be used as the hydrocarbon gas.

In order to obtain a film with high thermal stability, the hydrocarbon gas utilized in the present process is heavily diluted with hydrogen. The term heavily diluted is defined herein as an admixture of a hydrocarbon with hydrogen such that the final concentration of hydrogen in the admixture constitutes from about 99% to about 50% of the gas mixture. More preferably, the hydrocarbon is diluted with hydrogen such that the final concentration of hydrocarbon in the admixture is from about 2% to about 10%. Most preferably, the hydrocarbon constitutes about 2% of the overall gas mixture.

Gases employed by the method 200 can have a purity greater than about 95.5%. In a preferred embodiment, the gases have a purity in the range from about 98.5% to about 99.99%. Most preferably, the gases have a purity greater than 99.99%.

The high purity gases are pre-mixed before being introduced into the processing space 140. In step S230, above, the gas feed assembly 400 is operated and controlled to feed the gas mixture into the processing space 140 to provide a total pressure of hydrocarbon and hydrogen from about 1 mTorr to about 600 mTorr. To provide the most effective diamond type carbon film it is preferred that the pressure of the admixture of hydrocarbon and hydrogen be about 20-200 mTorr. The above conditions can also be obtained by controlling and operating the gas feed assembly 400 to feed each gas separately.

In step S230, the admixed gas is introduced into the processing space 140 at a flow of about 10 standard cubic centimeter per minute (sccm) to about 100 sccm. More preferably, the flow rate of the reactive gas is from about 30 to about 80 sccm. Most preferably, the flow rate of the admixture of hydrocarbon and helium is about 50 sccm. The mixture is introduced into the processing space 140 at a pressure of about 1 to about 1000 mTorr. In one example, the admixture may be introduced at a pressure of about 20 mTorr.

After the feeding of the admixed gas is initiated in step S230, in step S240, the microwave radiation assembly 600 is operated to direct microwave radiation into the processing space 140 and the UV radiation assembly 700 is operated to direct UV radiation into the processing space 140, whereupon H, $CH_3$, $CH_2$, . . . etc. radicals are released for deposition of diamond on the substrate. For CNx film, additional nitrogen source such as nitrogen or ammonia (NH3) are added. Additional doping agents can be added to the gas mixture to obtain a doped carbon film, for example, boron doped carbon film. Sometimes oxygenation sources such as $O_2$, $CO_2$, $H_2O$ are also added as a scavenger for hydrogen in the reactions.

Deposition Apparatus with Remote Reactant Excitation Chamber

Figure 10:
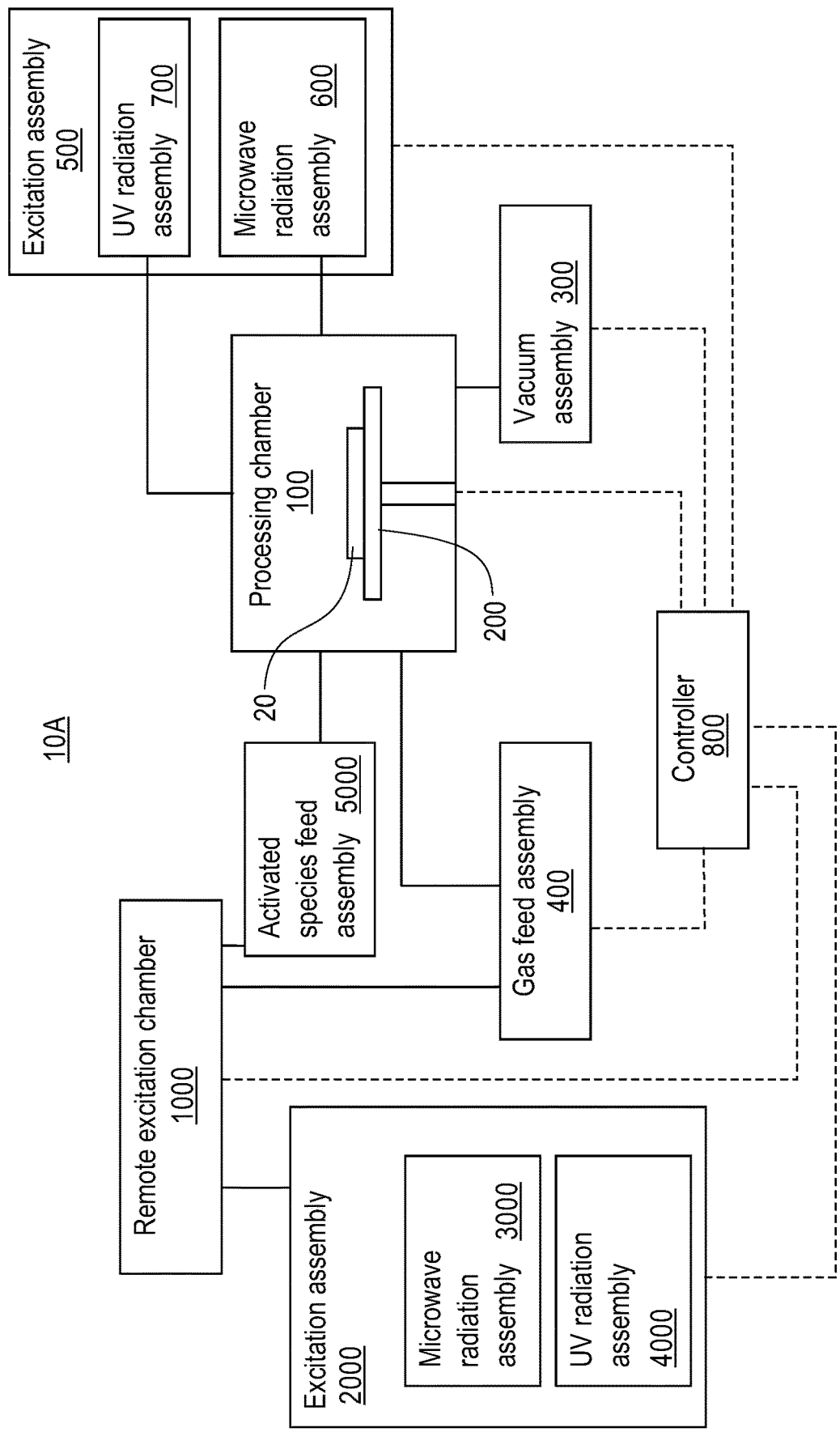
FIG. 10 is a schematic diagram of a deposition apparatus according to a fourth embodiment of the present invention.

Referring now to FIG. 10, a deposition apparatus 10A according to a fourth embodiment will be described in detail below.

The deposition apparatus 10A can include the processing chamber 100, the substrate stage 200, the vacuum assembly 300, the gas feed assembly 400, the excitation assembly 500, and the controller 800 described above.

The deposition apparatus 10A can further include a remote excitation chamber 1000, an excitation assembly 2000 including a microwave radiation assembly 3000 and an UV radiation assembly 4000, and an activated species feed assembly 5000.

The remote excitation chamber 1000 can have a similar construction as processing chamber body 110 of processing chamber 100.

The gas feed assembly 400 is configured to feed one or more reactive gases from one or more gas sources into the remote excitation chamber 1000. Specifically, the gas feed assembly 400 can be configured to feed one or more reactive gas such as nitrogen, oxygen, ammonia or hydrogen into the remote excitation chamber 1000.

The excitation assembly 2000 includes the microwave radiation assembly 3000 and the UV radiation assembly 4000, each of which is arranged to the remote excitation chamber 1000. The microwave radiation assembly 3000 can include a microwave power source and a microwave applicator such as the microwave power source 610 and the microwave applicator 630, described above. Microwave radiation generated by the microwave power source is propagated by the microwave applicator and emitted into an excitation space defined by the remote excitation chamber 1000. UV radiation generated by the UV radiation source is emitted into the excitation space.

The ultraviolet radiation assembly 4000 can include a UV radiation source assembly, and an optical window such as the UV radiation source assembly 710 and the optical window 720 described above.

The excitation assembly 2000 is controlled and operated to excite the reactive gas to form excited species. Specifically, the microwave radiation assembly 3000 and the UV radiation assembly 4000 can be individually operated and controlled to increase the internal energy of the reactive gas such that the reactive feed gas is dissociated into excited species.

In the fourth embodiment, the excitation space is provided remotely from the processing space 140. The activated species feed assembly 5000 can include a conduit connected at a first end to a port formed in the remote excitation chamber 1000 and connected at a second end to a port formed in the processing chamber 100. Activated species formed by irradiation with microwave radiation and UV radiation are transported by diffusion from the excitation space in the remote excitation chamber 1000 to the processing space 140 in the processing chamber 100 via the conduit.

The activated species feed assembly 5000 can further include one or more UV lamps arranged along the conduit. When one or more UV lamps are provided, the conduit is constructed of a material that permits transmission of UV radiation from the exterior of the conduit to the interior of the conduit. UV radiation from UV lamps sustain the activity of the activated species within conduit.

The activated species transported from the excitation space by the conduit into the processing space 140 of the processing chamber 100 reacts with a precursor gas to deposit a material on the substrate 20.

In the deposition apparatus 10A, the controller 800 can be further configured to control the operation of the remote excitation chamber 1000, the excitation assembly 2000, including the microwave radiation assembly 3000 and the UV radiation assembly 4000, and the activated species feed assembly 5000.

While the present invention has been particularly shown and described with respect to preferred embodiments thereof, it will be understood by those skilled in the art that the foregoing and other changes in forms and details may be made without departing from the spirit and scope of the present invention. It is therefore intended that the present invention not be limited to the exact forms and details described and illustrated, but fall within the scope of the appended claims.

What is claimed is:

1. An apparatus for depositing a material on a substrate, the apparatus comprising:
    a processing chamber defining a processing space in which the substrate is arranged;
    a remote excitation chamber that defines an excitation space, wherein the excitation space is provided remotely from the processing space,
    a gas feed assembly configured to feed:
        a precursor gas into the processing space, and
        a reactive gas into the excitation space,
    a first excitation assembly comprising a first ultraviolet radiation assembly configured to emit ultraviolet radiation into the excitation space to excite the reactive gas, and a first microwave radiation assembly configured to emit microwave radiation into the excitation space to excite the reactive gas, wherein the first microwave assembly comprises a magnetron as a microwave power source, and a waveguide and a microwave horn antenna as elements of a microwave applicator,
    a conduit communicating the excitation space and the processing space to facilitate diffusion of excited reactive gas from the excitation space to the processing space; and
    a second excitation assembly comprising a second ultraviolet radiation assembly configured to emit ultraviolet radiation into the processing space, and a second microwave radiation assembly configured to emit microwave radiation into the processing space.

2. The apparatus according to claim 1, wherein the first ultraviolet radiation assembly comprises:
    an ultraviolet source housing arranged to the remote excitation chamber; and
    an ultraviolet source arranged within the ultraviolet source housing and configured to emit ultraviolet radiation into the excitation space; and
    the first microwave radiation assembly comprises:
    a microwave power source configured to generate microwave radiation; and
    a microwave applicator configured to propagate the microwave radiation generated by the microwave power source and to emit the microwave radiation into the excitation space, and wherein the ultraviolet radiation assembly and the microwave radiation assembly are configured to be operated in combination to emit ultraviolet radiation and microwave radiation to excite the reactive gas in the excitation space.

3. The apparatus according to claim 1, wherein the gas feed assembly comprises a plurality of conduits, and wherein each of the plurality of conduits comprises:
    a coaxial inner conduit and an outer conduit, wherein the inner conduit defines a port through which the precursor gas is fed into the processing space, and wherein the inner conduit is configured to move relative to the outer conduit to position the port at a variable position in the processing space.

4. The apparatus according to claim 1, wherein the gas feed assembly comprises a ring-shaped conduit having a plurality of ports connected to the processing chamber and leading into the processing space, and the gas feed assembly provides fluid communication between a source of the precursor gas and the processing space.

5. The apparatus according to claim 1, further comprising:
    a controller configured to control the first microwave radiation assembly with pulse-time modulation.

6. The apparatus according to claim 1, wherein the material is deposited on the substrate in the processing space from a reaction of the precursor gas and the excited reactive gas.

7. The apparatus according to claim 1, wherein the processing chamber comprises a processing chamber body and a process chamber body temperature control assembly, wherein the processing body has a processing chamber body outer wall and a process chamber body inner wall.

8. The apparatus according to claim 7, wherein process chamber body temperature control assembly is configured to heat the processing space to a desired temperature and to maintain the desired temperature.

9. The apparatus according to claim 7, wherein process chamber body temperature control assembly is configured to cool the processing space to a desired temperature and to maintain the desired temperature.

10. The apparatus according to claim 1, wherein the processing spacer comprises a substrate stage assembly configured to mount the substrate, wherein the substrate stage assembly includes a substrate stage, a substrate stage support, a substrate stage driver, and a substrate stage temperature controller, wherein the substrate stage support supports the substrate stage in the processing space, and wherein the substrate stage driver is configured to rotate the substrate stage support about a central Z-axis and to move the substrate stage support along the central Z-axis.

11. The apparatus according to claim 1, further comprising a vacuum assembly configured to control a desired deposition pressure within the processing space.

12. The apparatus according to claim 11, wherein the vacuum assembly comprises a vacuum pump that is configured to evacuate the processing space through a duct to the desired deposition pressure.

13. The apparatus according to claim 1, wherein the first ultraviolet radiation assembly comprises a UV source unit, an optical window and a movable protective shutter.

14. The apparatus according to claim 1, wherein the processing space is cylindrical.

15. An apparatus for depositing a material on a substrate, the apparatus comprising:
    a processing chamber defining a processing space in which the substrate is arranged;
    a remote excitation chamber that defines an excitation space, wherein the excitation space is provided remotely from the processing space,
    a gas feed assembly configured to feed:
        a precursor gas into the processing space, and
        a reactive gas into the excitation space, wherein the gas feed assembly comprises a plurality of conduits, each of the plurality of conduits comprises a coaxial inner conduit and an outer conduit, wherein the inner conduit defines a port through which the precursor gas is fed into the processing space, and wherein the inner conduit is configured to move relative to the outer conduit to position the port at a variable position in the processing space,
    a first excitation assembly comprising a first ultraviolet radiation assembly configured to emit ultraviolet radiation into the excitation space to excite the reactive gas, and a first microwave radiation assembly configured to emit microwave radiation into the excitation space to excite the reactive gas;
    a conduit communicating the excitation space and the processing space to facilitate diffusion of excited reactive gas from the excitation space to the processing space; and
    a second excitation assembly comprising a second ultraviolet radiation assembly configured to emit ultraviolet radiation into the processing space, and a second microwave radiation assembly configured to emit microwave radiation into the processing space.

* * * * *